(12) United States Patent
Miyasaka et al.

(10) Patent No.: US 9,468,993 B2
(45) Date of Patent: Oct. 18, 2016

(54) METHOD FOR PRODUCING SEMICONDUCTOR DEVICE

(75) Inventors: Toshiyuki Miyasaka, Matsumoto (JP); Yuta Tamai, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/239,014

(22) PCT Filed: Sep. 12, 2012

(86) PCT No.: PCT/JP2012/073317
§ 371 (c)(1),
(2), (4) Date: Feb. 28, 2014

(87) PCT Pub. No.: WO2013/039099
PCT Pub. Date: Mar. 21, 2013

(65) Prior Publication Data
US 2014/0203420 A1    Jul. 24, 2014

(30) Foreign Application Priority Data

Sep. 15, 2011    (JP) ................................. 2011-201962

(51) Int. Cl.
*H01L 21/50*    (2006.01)
*H01L 23/047*    (2006.01)
(Continued)

(52) U.S. Cl.
CPC .............. *B23K 26/20* (2013.01); *H01L 21/50* (2013.01); *H01L 23/047* (2013.01); *H01L 23/49568* (2013.01); *H01L 25/18* (2013.01); *H01L 23/24* (2013.01); *H01L 23/3735* (2013.01); *H01L 23/49811* (2013.01); *H01L 24/29* (2013.01); *H01L 24/32* (2013.01); *H01L 24/33* (2013.01); *H01L 24/40* (2013.01); *H01L 24/73* (2013.01); *H01L 24/83* (2013.01); *H01L 24/84* (2013.01); *H01L 25/072* (2013.01); (Continued)

(58) Field of Classification Search
CPC ............ B23K 26/20; H01L 23/49568; H01L 23/047; H01L 21/50; H01L 25/18; H01L 25/072
See application file for complete search history.

(56) References Cited

U.S. PATENT DOCUMENTS

| 4,936,924 A * | 6/1990 | Inuzuka | H01L 31/046 136/249 |
| 2005/0152741 A1* | 7/2005 | Fujimoto | B23K 9/0026 403/270 |

(Continued)

FOREIGN PATENT DOCUMENTS

| JP | 2005-109147 A | 4/2005 |
| JP | 2005109147 A * | 4/2005 |

(Continued)

OTHER PUBLICATIONS

PCT, "International Search Report for International Application No. PCT/JP2012/073317".

*Primary Examiner* — Michele Fan
(74) *Attorney, Agent, or Firm* — Manabu Kanesaka (57) ABSTRACT

A method for producing a semiconductor device includes laser welding to bond an upper terminal and a lower terminal as internal wiring members of the semiconductor device. When the upper terminal is fixed to the lower terminal by the laser welding, a gap between an upper surface of the lower terminal and a lower surface of the upper terminal is equal to or more than 20 μm and equal to or less than 400 μm.

4 Claims, 8 Drawing Sheets

(51) Int. Cl.
  B23K 26/20 (2014.01)
  H01L 25/18 (2006.01)
  H01L 23/495 (2006.01)
  *H01L 23/00* (2006.01)
  *H01L 23/24* (2006.01)
  *H01L 25/07* (2006.01)
  *H01L 23/373* (2006.01)
  *H01L 23/498* (2006.01)

(52) U.S. Cl.
  CPC .......... *H01L 2224/291* (2013.01); *H01L 2224/32225* (2013.01); *H01L2224/33181* (2013.01); *H01L 2224/40095* (2013.01); *H01L 2224/40101* (2013.01); *H01L 2224/40137* (2013.01); *H01L 2224/73263* (2013.01); *H01L 2224/83815* (2013.01); *H01L 2224/84214* (2013.01); *H01L 2924/014* (2013.01); *H01L 2924/1203* (2013.01); *H01L 2924/12042* (2013.01); *H01L 2924/13055* (2013.01); *H01L 2924/15788* (2013.01)

(56) References Cited

U.S. PATENT DOCUMENTS

| | | | | |
|---|---|---|---|---|
| 2007/0249152 | A1* | 10/2007 | Tanaka | H01L 23/49524 438/597 |
| 2007/0284341 | A1* | 12/2007 | Gasquet | B23K 15/02 219/121.14 |
| 2010/0224601 | A1* | 9/2010 | Sugaya | H01R 13/6666 219/121.64 |
| 2013/0183575 | A1* | 7/2013 | Goto | H01G 11/82 429/163 |
| 2013/0202951 | A1* | 8/2013 | Kawai | H01G 11/82 429/178 |

FOREIGN PATENT DOCUMENTS

| | | |
|---|---|---|
| JP | 2008-028286 A | 2/2008 |
| JP | 2008-066561 A | 3/2008 |
| JP | 2008066561 A * | 3/2008 |
| JP | 2010-141163 A | 6/2010 |
| WO | WO2012011362 A1 * | 1/2012 |

* cited by examiner

METHOD FOR PRODUCING SEMICONDUCTOR DEVICE

TECHNICAL FIELD

The present invention relates to a method for producing a semiconductor device, such as a power semiconductor module, and a semiconductor device produced by the production method, and more particularly, to a method for producing a semiconductor device in which lead frames (upper and lower terminals) provided between components of the semiconductor device are fixed to each other by laser welding and a semiconductor device produced by the production method.

BACKGROUND ART

In a power semiconductor module, with an increase in current capacity and a reduction in the size of the power semiconductor module, a semiconductor chip is used at high current density. Therefore, it is important to effectively dissipate the heat generated from the semiconductor chip in order to ensure reliability during a high-power operation.

FIGS. 9 to 12 are cross-sectional views illustrating production processes of a method for producing a main portion of a power semiconductor module according to the related art.

Figure 9:
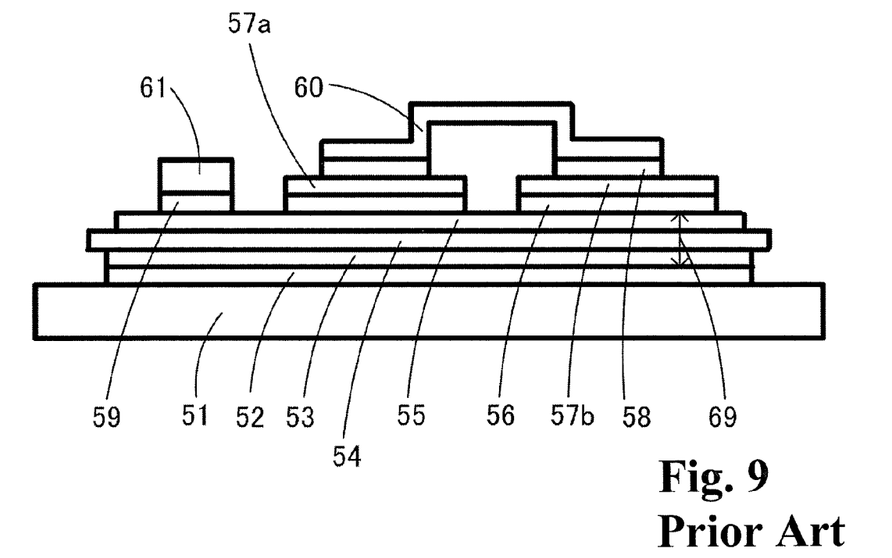
FIG. 9 is a cross-sectional view illustrating a process of producing a main portion of a power semiconductor module according to the related art.

In FIG. 9, solder 52 is provided on a heat dissipating base 51 and an insulating substrate 69 with a conductive pattern is provided on the solder 52. In the insulating substrate 69 with a conductive pattern, a rear conductive film 53 is formed on the rear surface of an insulating substrate 54 which is made of, for example, ceramic and a conductive pattern 55 is formed on the front surface thereof. Then, solder 56 is provided on the conductive pattern 55 of the insulating substrate 69 with a conductive pattern. An IGBT chip 57a is provided on the solder 56, with a collector electrode (not illustrated) down, and an FWD chip 57b is provided on the solder 56, with a cathode electrode (not illustrated) down. Then, solder 58 is provided on an emitter electrode (not illustrated) of the IGBT chip 57a and an anode electrode (not illustrated) of the FWD chip 57b. Then, an emitter lower terminal 60 is provided on the solder 58. In addition, solder 59 is provided on the conductive pattern 55 of the insulating substrate 69 with a conductive pattern and a collector lower terminal 61 is provided on the solder 59. Then, in this state, heat is applied to melt the solders 52, 56, 58, and 59 and the solders 52, 56, 58, and 59 are cooled and re-solidified such that the members are fixed and integrated by the solders 52, 56, 58, and 59. Here, the solder before it is melted, and the solder while it is being melted, and the solder after it is solidified are denoted by the same reference numeral.

Figure 10:
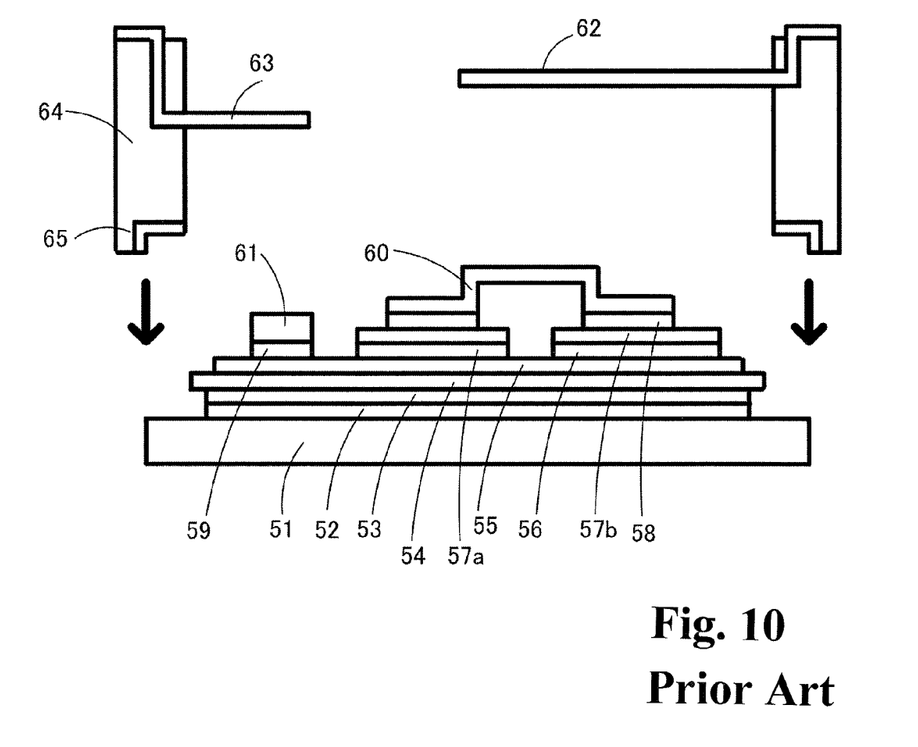
FIG. 10 is a cross-sectional view illustrating a process of producing the main portion of the power semiconductor module according to the related art, which follows the process illustrated in FIG. 9.

Then, in FIG. 10, a resin case 64 having the emitter upper terminal 62 and the collector upper terminal 63 formed integrally therewith is covered and the lower portion of the resin case 64 is fitted to an outer circumferential portion of the heat dissipating base 51. An adhesive 65 for adhesion to the heat dissipating base 51 is applied to the lower portion of the resin case 64.

Figure 11:
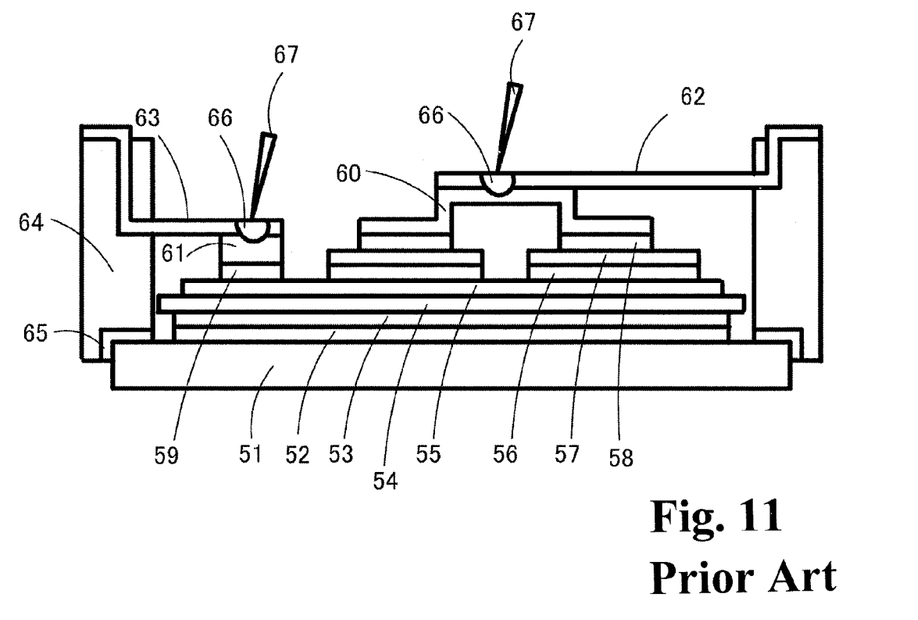
FIG. 11 is a cross-sectional view illustrating a process of producing the main portion of the power semiconductor module according to the related art, which follows the process illustrated in FIG. 10.

Then, in FIG. 11, the adhesive 65 is heated and hardened to fix the resin case 64 and the heat dissipating base 51. In this case, the opposite surfaces of the emitter upper terminal 62 and the emitter lower terminal 60 close contact each other and the opposite surfaces of the collector upper terminal 63 and the collector lower terminal 61 close contact each other. A laser beam 67 is radiated to the surfaces of the emitter upper terminal 62 and the collector upper terminal 63. With this irradiation, the laser beam 67 is absorbed by the outermost surfaces of the upper terminals 62 and 63 and is then converted into thermal energy. Then, each terminal is melted and a welded portion 66 is formed. Therefore, the upper and lower terminals 62 and 60 are fixed to each other by laser welding and the upper and lower terminals 63 and 61 are fixed to each other by laser welding.

Figure 12:
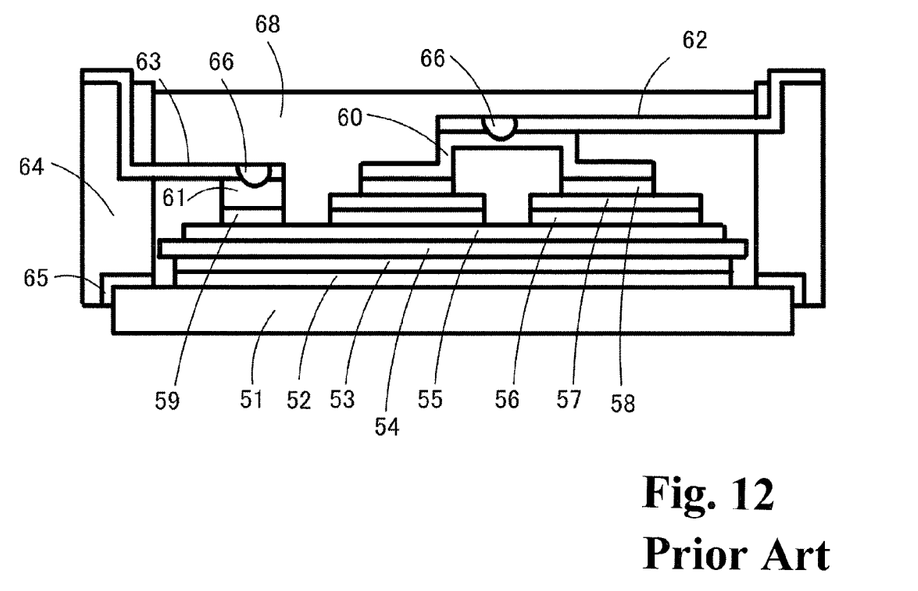
FIG. 12 is a cross-sectional view illustrating a process of producing the main portion of the power semiconductor module according to the related art, which follows the process illustrated in FIG. 11.

Then, in FIG. 12, the resin case 64 is filled with a sealing material 68, such as silicon gel or epoxy resin, to complete a power semiconductor module.

Figure 13:
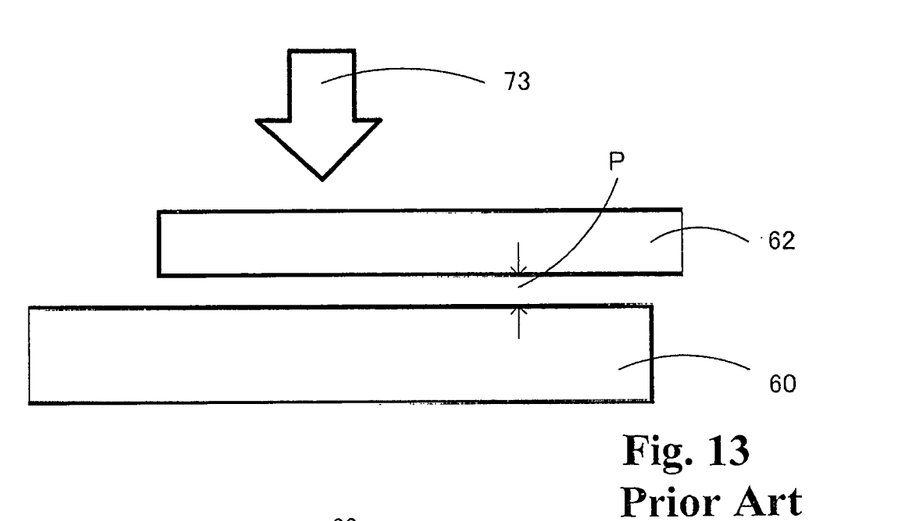
FIG. 13 is a diagram illustrating a case in which a load is applied to bring the upper terminal into close contact with the lower terminal.

In the process illustrated in FIG. 10, when a gap is formed between the upper and lower terminals 62 and 60, a load 73 is applied to remove the gap P such that the upper and lower terminals 62 and 60 contact each other, as illustrated in FIG. 13.

Figure 14:
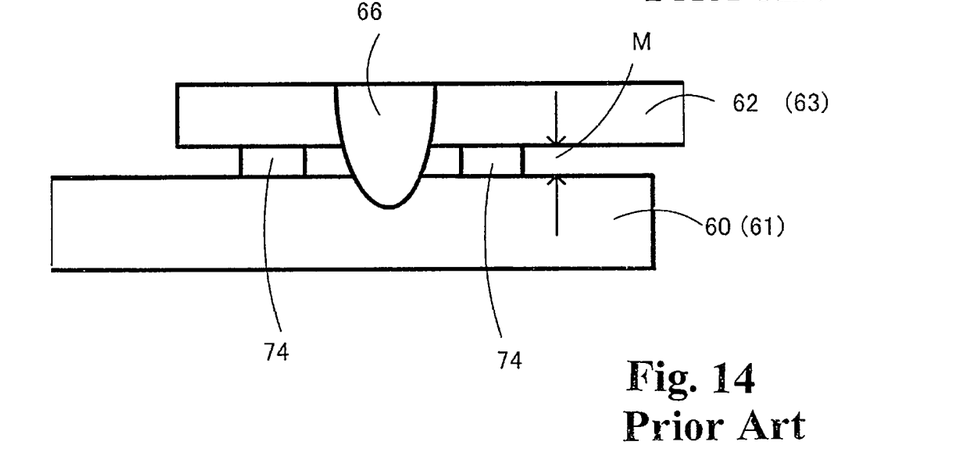
FIG. 14 is a diagram illustrating a case in which the gap between the upper and lower terminals is about 10 μm during laser welding.

As such, when the upper and lower terminals 62 and 60 are fixed by laser welding while contacting each other, a variation in bonding strength occurs. Therefore, Patent Document 1 discloses a technique in which spacers 74 are provided between the opposite surfaces of the emitter upper terminal 62 and the emitter lower terminal 60 and between the opposite surfaces of the collector upper terminal 63 and the collector lower terminal 61 to form a gap M of about 10 μm therebetween and laser welding is performed for the upper and lower terminals, as illustrated in FIG. 14.

CITATION LIST

Patent Document

Patent Document 1: Japanese Patent Application Laid-Open No. 2008-66561

SUMMARY OF THE INVENTION

Problems to be Solved by the Invention

However, as illustrated in FIG. 14, when the gap M of about 10 μm is provided, bonding strength and a variation in bonding strength are improved, as compared to when the upper and lower terminals close contact each other, but the bonding strength is not necessarily sufficient.

In order to maintain the gap M to be 10 μm, it is necessary to reduce the dimension tolerance of the gap M between the upper and lower terminals and thus reduce a variation in the gap M. In this case, assemblability is reduced and production costs increase.

In addition, when welding is performed at a plurality of points in order to ensure sufficient bonding strength, the production costs of the module increase.

The invention has been made in view of the above-mentioned problems and an object of the invention is to provide a method for producing a semiconductor device and a semiconductor device produced by the production method which can improve the bonding strength of the upper and lower terminals per point, increase the gap between the upper and lower terminals during laser welding, improve assemblability, and reduce production costs.

Solutions to Problems

In order to achieve the object, according to a first aspect of the invention, a method for producing a semiconductor device includes laser welding for bonding an upper terminal and a lower terminal defining internal wiring members of the semiconductor device. When the upper terminal is laser welded to fix to the lower terminal, a gap between an upper surface of the lower terminal and a lower surface of the upper terminal is equal to or more than 20 μm and equal to or less than 400 μm.

According to a second aspect of the invention, in the method for producing the semiconductor device according to the first aspect, a step portion may be provided on a rear surface of the upper terminal. A portion of the rear surface of the upper terminal in which the step portion is not formed may close contact the upper surface of the lower terminal. A gap is formed by the step portion. In the laser welding, a laser beam may be radiated to the surface of the upper terminal immediately above the step portion to weld the upper terminal and the lower terminal. The gap formed by the step portion may be equal to or more than 20 μm and equal to or less than 400 μm.

According to a third aspect of the invention, in the method for producing the semiconductor device according to the first aspect, a step portion may be provided on the upper surface of the lower terminal. A portion of the upper surface of the lower terminal in which the step portion is not formed may close contact the rear surface of the upper terminal. A gap may be formed by the step portion. In the laser welding, a laser beam may be radiated to the surface of the upper terminal immediately above the step portion to weld the upper terminal and the lower terminal. The gap formed by the step portion may be equal to or more than 20 μm and equal to or less than 400 μm.

According to a fourth aspect of the invention, in the method for producing the semiconductor device according to the first aspect, a burr portion may be provided in an outer circumferential portion of the rear surface of the upper terminal. A leading end of the burr portion in the rear surface of the upper terminal may close contact the upper surface of the lower terminal to form a gap. In the laser welding, a laser beam may be radiated to the surface of the upper terminal above the gap to weld the upper terminal and the lower terminal. The gap formed by the burr portion may be equal to or more than 20 μm and equal to or less than 400 μm.

According to a fifth aspect of the invention, in the method for producing the semiconductor device according to the first aspect, a burr may be provided in an outer circumferential portion of the upper surface of the lower terminal. A leading end of the burr in the upper surface of the lower terminal may close contact the rear surface of the upper terminal to form a gap. In the laser welding, a laser beam may be radiated to the surface of the upper terminal above the gap to weld the upper terminal and the lower terminal. The gap formed by the burr may be equal to or more than 20 μm and equal to or less than 400 μm.

According to a sixth aspect of the invention, there is provided a method for producing a semiconductor device including an insulating substrate with a conductive pattern, a semiconductor chip fixed to an upper surface of the insulating substrate with the conductive pattern, a lower terminal fixed to an upper surface of the semiconductor chip or the upper surface of the insulating substrate with a conductive pattern, and an upper terminal which is fixed to the lower terminal by laser welding. The method includes providing a gap securing member on the lower terminal or the insulating substrate with a conductive pattern and providing the upper terminal on the gap securing member. A gap between the upper and lower terminals at a position where the laser welding is performed is equal to or more than 20 μm and equal to or less than 400 μm.

According to a seventh aspect of the invention, in the method for producing the semiconductor device according to the sixth aspect, the gap securing member may be a gap forming component. The gap forming component may be fixed to an upper surface of the lower terminal. The upper terminal may be fixed by the gap forming component. The gap between the upper and lower terminals may be equal to or more than 20 μm and equal to or less than 400 μm.

According to an eighth aspect of the invention, in the method for producing the semiconductor device according to the sixth aspect, the gap securing member may be a spacer for forming the gap.

According to a ninth aspect of the invention, there is provided a semiconductor device that is produced by the method for producing the semiconductor device according to any one of the first to eighth aspects. In the semiconductor device, a gap is provided between an upper terminal and a lower terminal in the vicinity of a laser welded portion.

According to a tenth aspect of the invention, in the semiconductor device according to the ninth aspect, the gap may be equal to or less than 350 μm.

Effects of the Invention

According to the invention, since the gap between the upper terminal and the lower terminal is equal to or more than 20 μm and equal to or less than 400 μm, it is possible to increase laser welding strength per point.

Therefore, it is possible to reduce the number of welding points (the number of welding positions) and thus reduce production costs.

Even when the dimension tolerance and assembly tolerance of components are large, it is possible to improve bonding strength if the gap between the upper and lower terminals is equal to or more than 20 μm and equal to or less than 400 μm. That is, it is possible to increase the dimension tolerance and assembly tolerance of components and improve assemblability and productivity. Therefore, it is possible to reduce production costs.

The above and other objects, features, and advantages of the invention will become more apparent by describing in detail preferred embodiments thereof with reference to the attached drawings.

BRIEF DESCRIPTION OF DRAWINGS

FIGS. 6(a)-6(d) are diagrams illustrating another method of forming the gap; wherein

MODE FOR CARRYING OUT THE INVENTION

Hereinafter, the following embodiments of the invention will be described. In the following embodiments, the same components as those in the related art are denoted by the same reference numerals.

Embodiment 1

FIGS. 1 to 4 are cross-sectional views illustrating production processes in a method for producing a main portion of a semiconductor device according to a first embodiment of the invention. In this embodiment, a power semiconductor module is given as an example of the semiconductor device.

Figure 1:
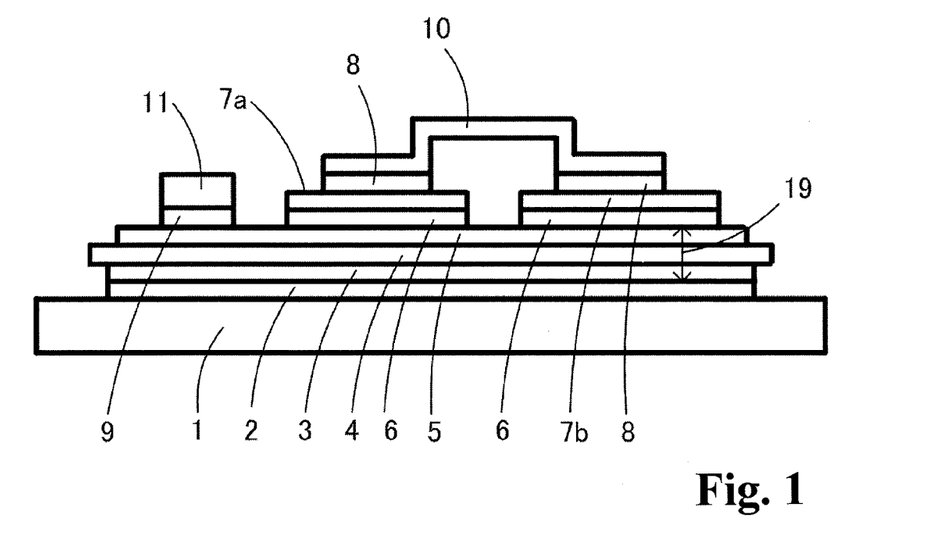
FIG. 1 is a cross-sectional view illustrating a process of producing a main portion of a semiconductor device according to a first embodiment of the invention.

In FIG. 1, solder 2 is provided on a heat dissipating base 1 and an insulating substrate 19 with a conductive pattern is provided on the solder 2. In the insulating substrate 19 with a conductive pattern, a rear conductive film 3 is formed on the rear surface of an insulating substrate 4 which is made of, for example, ceramic and a conductive pattern 5 is formed on the front surface thereof. Then, solder 6 is provided on the conductive pattern 5 of the insulating substrate 19 with a conductive pattern. An IGBT chip 7a is provided on the solder 6, with a collector electrode (not illustrated) down, and a FWD chip 7b is provided on the solder 6, with a cathode electrode (not illustrated) down. Then, solder 8 is provided on an emitter electrode (not illustrated) of the IGBT chip 7a and an anode electrode (not illustrated) of the FWD chip 7b. Then, an emitter lower terminal 10 is provided on the solder 8. In addition, solder 9 is provided on the conductive pattern 5 of the insulating substrate 19 with a conductive pattern and a collector lower terminal 11 is provided on the solder 9. Then, in this state, heat is applied to melt the solders 2, 6, 8, and 9 and the solders 2, 6, 8, and 9 are cooled and re-solidified to fix each member. In this way, the members are integrated through the solders 2, 6, 8, and 9. In this embodiment, the solder is denoted by the same reference numeral before it is melted, while it is being melted, and after it is solidified.

Figure 2:
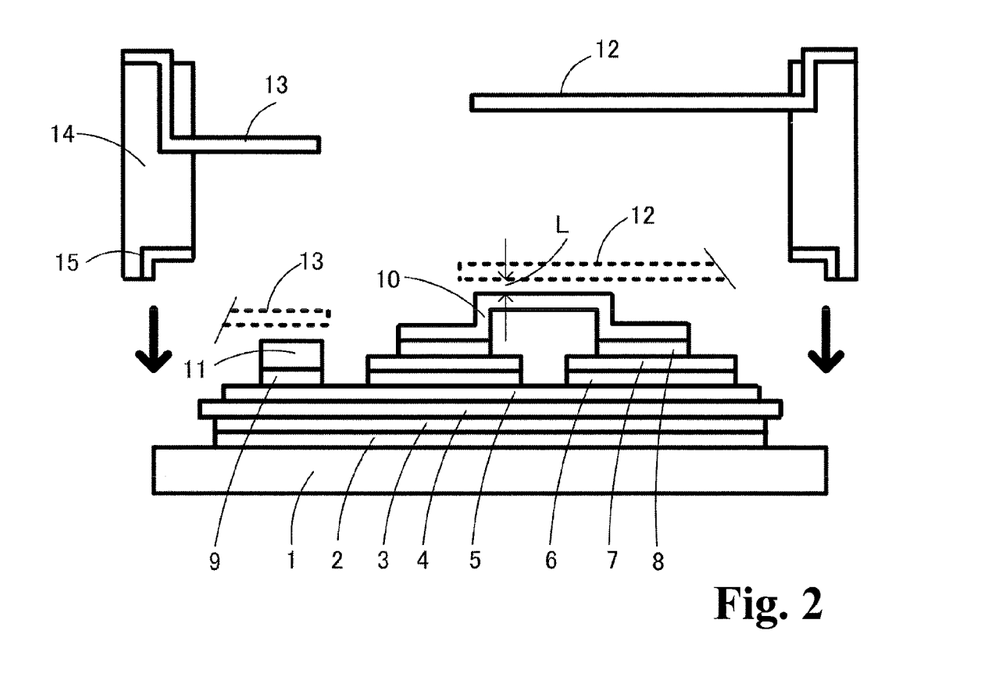
FIG. 2 is a cross-sectional view illustrating a process of producing the main portion of the semiconductor device according to the first embodiment of the invention, which follows the process illustrated in FIG. 1.

Then, in FIG. 2, a resin case 14 having an emitter upper terminal 12 and a collector upper terminal 13 formed integrally therewith is covered and the lower portion of the resin case 14 is fitted to an outer circumferential portion of the heat dissipating base 1. An adhesive 15 for adhesion to the heat dissipating base 1 is applied to the lower portion of the resin case 14.

For example, the upper terminals 12 and 13 have a thickness of 0.8 mm, a width of 20 mm, and a length of 60 mm and the lower terminals 10 and 11 have a thickness of 1.5 mm, a width of 20 mm, and a length of 60 mm. In addition, the overlap length between the upper terminal and the lower terminal is 20 mm.

Figure 3:
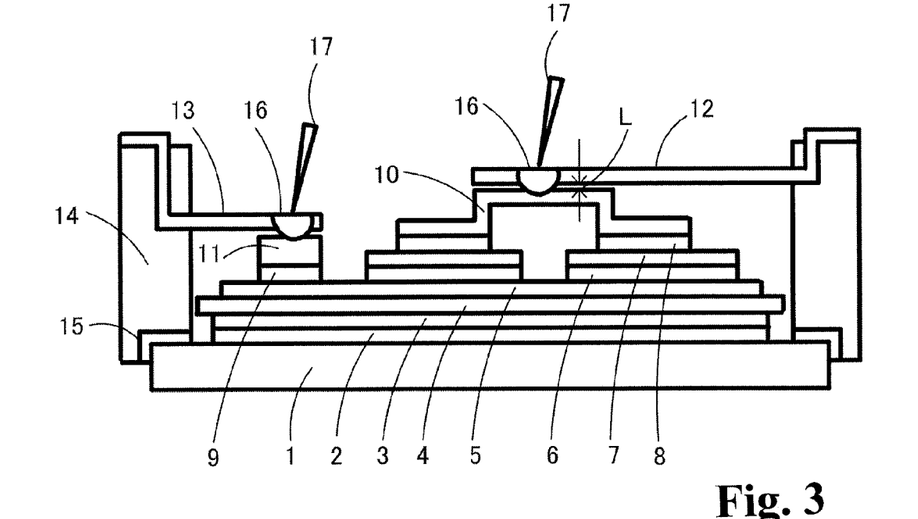
FIG. 3 is a cross-sectional view illustrating a process of producing the main portion of the semiconductor device according to the first embodiment of the invention, which follows the process illustrated in FIG. 2.

Then, in FIG. 3, when the resin case 14 is fitted to the outer circumferential portion of the heat dissipating base 1, a gap L that is equal to or more than 20 μm and equal to or less than 400 μm is provided between the opposite surfaces of the emitter upper terminal 12 and the emitter lower terminal 10 and between the opposite surfaces of the collector upper terminal 13 and the collector lower terminal 11. Then, the adhesive 15 is heated and hardened to fix the resin case 14 and the heat dissipating base 1. Then, a laser beam 17 is radiated to the surfaces of the emitter upper terminal 12 and the collector upper terminal 13. With this irradiation, the laser beam 17 is absorbed by the outermost surfaces of the upper terminals 12 and 13 and is then converted into thermal energy. Then, each terminal is melted and a welded portion 16 is formed. The upper and lower terminals are fixed by laser welding. After the laser welding, a gap K between the upper terminals 12 and 13 and the lower terminals 10 and 11 is about 50 μm to 80 μm less than the gap (L) before welding. This phenomenon occurs since the volume of the welded portion 16 is reduced when the terminal melted by the laser welding is solidified.

After the laser welding, the gap K between the upper and lower terminals is from (L−50 μm) to (L−80 μm), that is, from 0 μm to 350 μm (=400 μm−50 μm). As illustrated in the drawings, the gap K is the gap between the upper and lower terminals at the position that is away from the welded portion 16. That is, the maximum gap K between the upper terminal and the lower terminal is 350 μm.

Figure 4:
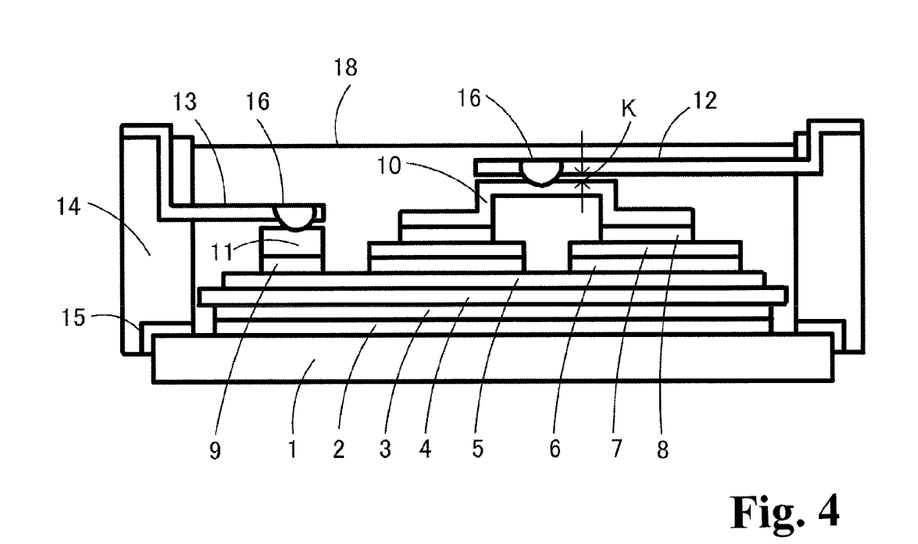
FIG. 4 is a cross-sectional view illustrating a process of producing the main portion of the semiconductor device according to the first embodiment of the invention, which follows the process illustrated in FIG. 3.

Then, in FIG. 4, the resin case 14 is filled with a sealing material 18, such as silicone gel or epoxy resin, to complete a power semiconductor module.

Figure 5:
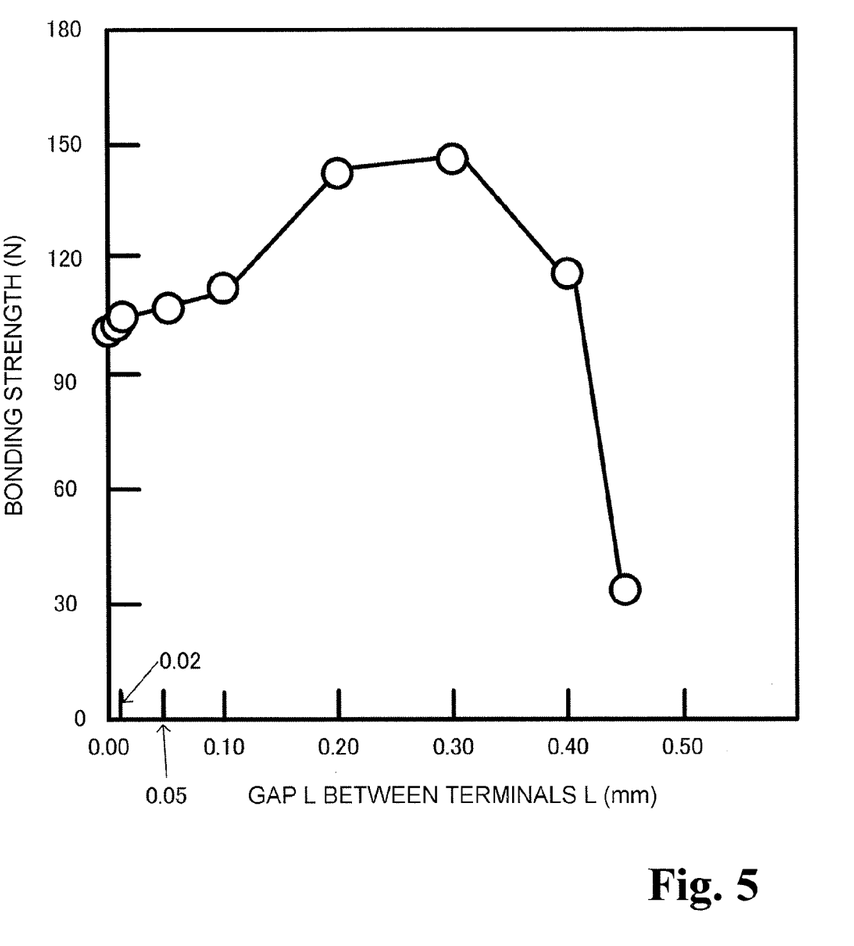
FIG. 5 is a diagram illustrating the relation between a gap between upper and lower terminals, and bonding strength.

FIG. 5 is a diagram illustrating the relation between the gap between the upper and lower terminals and bonding strength, which is data obtained by experiments.

As illustrated in FIG. 5, the bonding strength increases until the gap L becomes 300 μm and starts to decrease from the gap L exceeding 300 μm. The bonding strength when the gap is equal to or less than 400 μm is more than that when the gap is 10 μm. Therefore, when the gap L is equal to or more than 20 μm and equal to or less than 400 μm, the bonding strength is more than that when the gap L is 10 μm.

When the gap L between the upper and lower terminals is set to be equal to or more than 20 μm and equal to or less than 400 μm, the bonding strength per point can be more than that when the semiconductor device producing method disclosed in Patent Document 1 is used (a gap of about 10 μm).

When the gap L between the upper and lower terminals is equal to or more than 50 μm and equal to or less than 400 μm, the bonding strength can be more than that when the gap L is 20 μm. When the gap L between the upper and lower terminals is equal to or more than 100 μm and 400 μm, the bonding strength can be more than that when the gap L is 50 μm.

As a result, it is possible to reduce the number of welding points per module and thus reduce production costs.

Even when the gap L between the upper and lower terminals is formed due to the dimension tolerance and assembly tolerance of components, it is possible to increase the bonding strength if the gap L is equal to or more than 20 μm and equal to or more less 400 μm. Therefore, the dimension tolerance and assembly tolerance of component increase, assemblability is improved, and productivity is improved. As a result, it is possible to reduce production costs. Even when the lower limit of the gap L between the upper and lower terminals is 50 μm or 100 μm, it is possible to further increase the dimension tolerance or assembly tolerance of the original component.

Next, the relation (mechanism) between the gap between the upper and lower terminals and bonding strength will be described. When a gap (space) is provided between the upper and lower terminals, it serves as a thermal resistor and the amount of heat dissipated from a molten portion of the upper terminal to the lower terminal, which is the opposite bonding party, through a bonding interface is limited. Therefore, the gap functions as a heat storage and thermal energy which is transmitted from the molten portion of the upper terminal is sufficiently stored in the gap. As a result, even when a low-power laser beam is radiated, the depth of the molten portion of the upper terminal is sufficiently grown to the rear surface of the upper terminal and molten metal of the upper terminal is infiltrated to fill the gap. Therefore, the bonding area between the upper and lower terminals increases.

In this case, when the gap between the upper and lower terminals is very small, the upper and lower terminals substantially close contact each other and the above-mentioned heat storage effect is not obtained. On the other hand, when the gap is very large, the growth of the melting depth is hindered. When the gap exceeds 400 μm which is a very large value, the heat storage effect is reduced and the bonding area is reduced. The result proved that, when the gap was set to be equal to or more than 20 μm and equal to or less than 400 μm, the effective heat storage effect was obtained and it was possible to form a welded portion with high bonding strength.

For laser welding, in some cases, gas in a small space between the upper and lower members which are arranged so as to overlap each other and are to be welded expands during welding and the member to be welded is deformed.

In addition, in some cases, the expansion of gas causes the molten portion to be solidified while a void remains in the molten portion and the strength of the welded portion is reduced.

However, in the invention, as illustrated in FIG. 3 or FIG. 4, the space between the upper terminal 12 and the lower terminal 10 of the welded portion 16 to be subjected to laser welding or the space between the upper terminal 13 and the lower terminal 11 of the welded portion 16 to be subjected to laser welding is not a closed space, but is an open space. Therefore, when gas near the welded portion is heated by laser beams, gas between the upper terminal and the lower terminal is evacuated and the member is not deformed by the pressure of gas. In addition, a void is less likely to be formed in the molten portion.

In Embodiment 1, the upper terminal (12 or 13) and the lower terminal (10 or 11) are arranged in parallel in the vicinity of the welded portion 16 to secure an open space therebetween. In any structure in which the open space is formed, the same operation and effect as those in this embodiment are obtained.

Figure 6A:
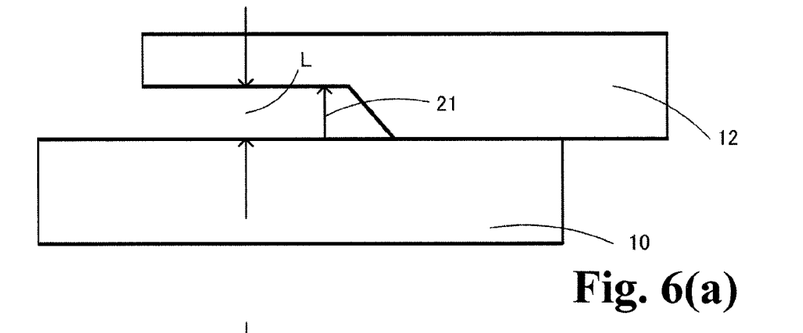
FIG. 6(a) is a diagram when a welding position of the upper terminal is thinned to form a step portion.
Figure 6B:
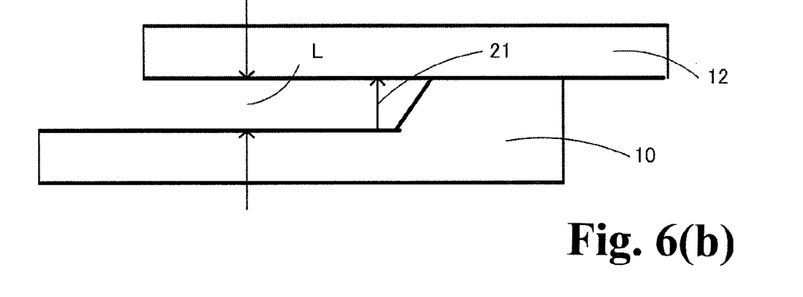
FIG. 6(b) is a diagram when a welding position of the lower terminal is thinned to form a step portion.
Figure 6C:
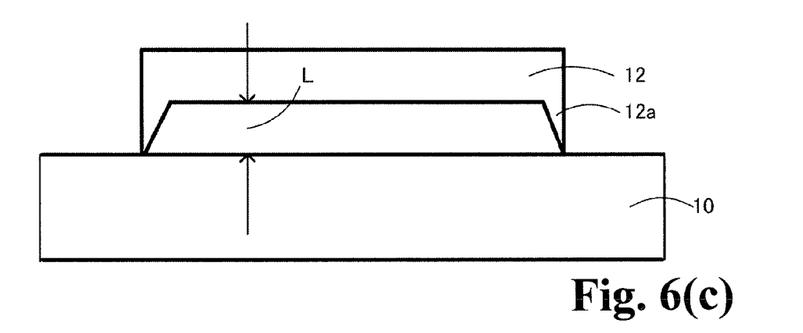
FIG. 6(c) is a diagram when a burr portion is formed in the upper terminal by a punching die.
Figure 6D:
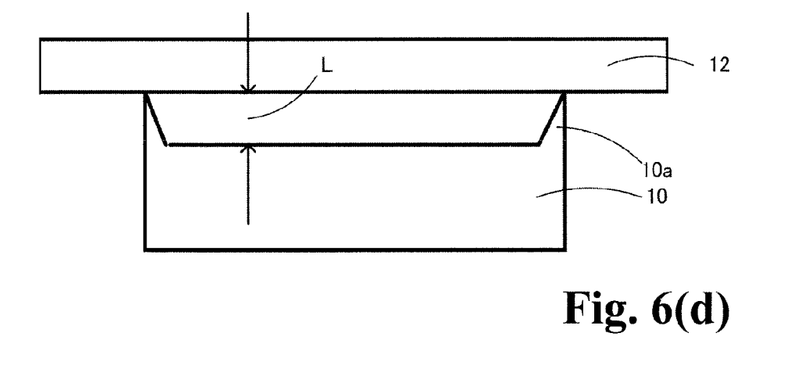
FIG. 6(d) is a diagram when the burr portion is formed in the lower terminal by the punching die.

FIGS. 6(a)-6(d) are diagrams illustrating another method of forming the gap L. FIG. 6(a) is a diagram when a welding position of the upper terminal 12 is thinned to form a step portion 21. FIG. 6(b) is a diagram when a welding position of the lower terminal 10 is thinned to form the step portion 21. FIG. 6(c) is a diagram when a burr portion 12a is formed in the upper terminal 12 by a punching die. FIG. 6(d) is a diagram when a burr portion 10a is formed in the lower terminal 10 by the punching die. FIGS. 6(a) to 6(d) illustrate the emitter upper terminal 12 and the emitter lower terminal 10. However, the structures illustrated in FIGS. 6(a) to 6(d) hold for the collector upper terminal 13 and the collector lower terminal 11.

In FIGS. 6(a) and 6(b), since the step portion 21 is formed by crushing or cutting to form the thin portion, it is possible to reliably secure a desired gap L, as compared to when the burr portions 10a and 12a illustrated in FIGS. 6(c) and 6(d) are used as the gap L. In addition, although not illustrated in the drawings, the step portions 21 may be formed in both the upper terminal 12 and the lower terminal 10 and face each other to form the gap L.

Figure 7:
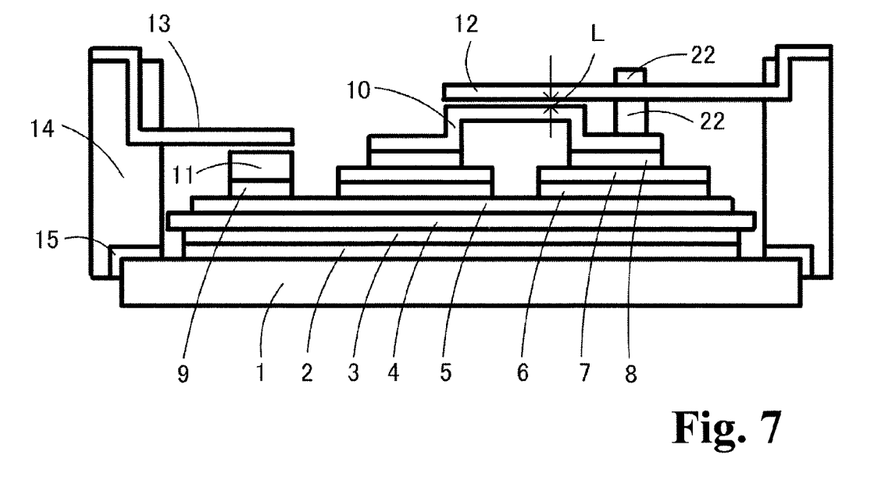
FIG. 7 is a diagram illustrating another method of forming the gap different from that illustrated in FIGS. 6(a)-6(d).

FIG. 7 is a diagram illustrating a method of forming the gap L different from that illustrated in FIGS. 6(a)-6(d). A gap forming component 22 is fixed to the upper terminal 12 when the resin case is molded. When the resin case 14 is fitted to the heat dissipating base 1 from the upper side, the gap forming component 22 contacts the lower terminal 10. Although not illustrated in the drawings, in some cases, the gap forming component 22 contacts the conductive pattern 5. When the gap forming component 22 contacts the lower terminal 10, the gap L between the upper and lower terminals is equal to or more than 20 μm and equal to or less than 400 μm. This is effective when the length of the upper terminal 12 is large (for example, about 60 mm or more).

Although not illustrated in the drawings, instead of the gap forming component 22, a spacer may be inserted between the upper and lower terminals 10 and 12 to secure the gap L.

When the gap L between the upper terminal 12 and the lower terminal 10 can be equal to or more than 20 μm and equal to or less than 400 μm, the upper and lower terminals 12 are not necessarily arranged in parallel to the lower terminal 10. As such, the gap L between the upper terminal 12 and the lower terminal 10 may be equal to or more than 20 μm and equal to or less than 400 μm. Therefore, the assembly tolerance margin is established and assemblability is improved, as compared to when a gap M of 10 μm is required as in the related art.

Although not illustrated in the drawings, a concave portion may be formed in the upper terminal 12 or/and the lower terminal 10 below the portion to be subjected to laser welding to form the gap, without forming the step portion 21.

Embodiment 2

Figure 8:
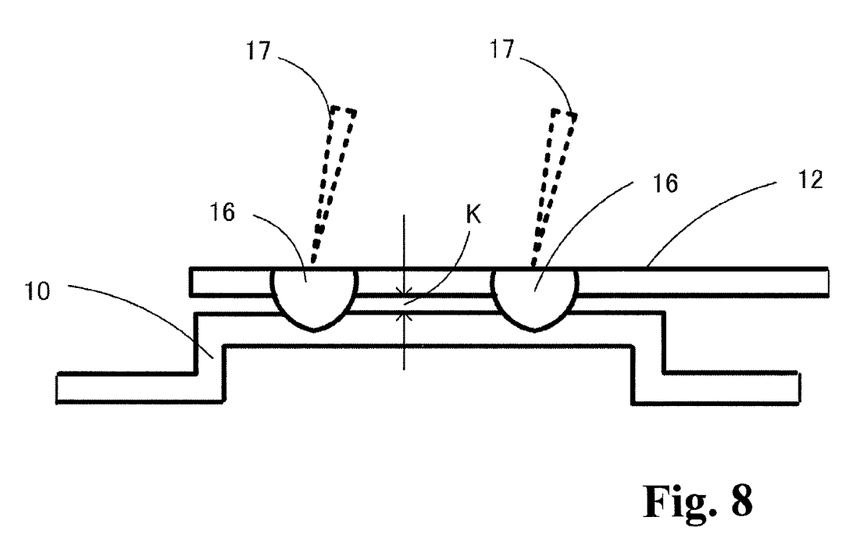
FIG. 8 is a cross-sectional view illustrating a main portion of a semiconductor device according to a second embodiment of the invention.

FIG. 8 is a cross-sectional view illustrating a main portion of a semiconductor device according to a second embodiment of the invention. FIG. 8 is a cross-sectional view illustrating upper and lower terminals 10 and 12 after laser welding is performed at two points. The semiconductor device is produced by the production method according to Embodiment 1. A gap K between the upper and lower terminals in the vicinity of a welded portion 16 is equal to or less than 350 μm. When a gap L between the upper and lower terminals before welding is in the range of 50 μm to 80 μm, the gap K between the upper and lower terminals after welding is 0 μm, that is, the gap K is not formed.

Only the principle of the invention has been described above. Various modifications and changes of the invention can be made by those skilled in the art. The invention is not limited to the above-mentioned accurate structure and applications and all of the corresponding modifications and equivalents are included in the scope of the invention defined by the appended claims and equivalents thereof.

REFERENCE SIGNS LIST

1 HEAT DISSIPATING BASE
2, 6, 8, 9 SOLDER
3 REAR CONDUCTIVE FILM
4 INSULATING SUBSTRATE
5 CONDUCTIVE PATTERN
7a IGBT CHIP
7b FWD CHIP
10 EMITTER LOWER TERMINAL (LOWER TERMINAL)
10a, 12a BURR PORTION
11 COLLECTOR LOWER TERMINAL (LOWER TERMINAL)
12 EMITTER UPPER TERMINAL (UPPER TERMINAL)
13 COLLECTOR UPPER TERMINAL (UPPER TERMINAL)
14 RESIN CASE
15 ADHESIVE
16 WELDED PORTION
17 LASER BEAM
18 SEALING MATERIAL
19 INSULATING SUBSTRATE WITH CONDUCTIVE PATTERN
21 STEP PORTION
22 GAP FORMING COMPONENT
L GAP (BEFORE LASER WELDING AND DURING LASER WELDING)
K GAP (AFTER LASER WELDING)

What is claimed is:

1. A method for producing a semiconductor device, comprising:
   forming a step portion on a rear surface of an upper terminal,
   close contacting the rear surface of the upper terminal where the step portion is not formed, to an upper surface of a lower terminal to thereby set a gap at the step portion between the upper surface of the lower terminal and the rear surface of the upper terminal to equal to or more than 20 μm and equal to or less than 400 μm, said gap being laterally open between the lower terminal and the upper terminal without being closed, said lower and upper terminals being internal wiring members of the semiconductor device, and
   radiating a laser beam to a surface of the upper terminal immediately above the step portion to laser-weld the upper terminal directly to the lower terminal while keeping the gap between the upper terminal and the lower terminal.

2. The method for producing the semiconductor device according to claim 1, wherein forming the step portion on the rear surface of the upper terminal comprises thinning one end portion of the upper terminal.

3. The method for producing the semiconductor device according to claim 2, wherein in thinning the one end portion of the upper terminal, the step portion is formed to have an open end and a closed end having an inclined surface after close contacting the rear surface of the upper terminal where the step portion is not formed to the upper surface of the lower terminal.

4. The method for producing the semiconductor device according to claim 3, wherein thinning the one end portion of the upper terminal includes cutting or crushing the one end portion of the upper terminal.

* * * * *